United States Patent [19]
Boyd et al.

[11] Patent Number: 5,973,977
[45] Date of Patent: Oct. 26, 1999

[54] POLY FUSES IN CMOS INTEGRATED CIRCUITS

[75] Inventors: Graeme B. Boyd, North Vancouver; Kris Iniewski, Coquitlam, both of Canada

[73] Assignee: PMC-Sierra Ltd., Burnaby, Canada

[21] Appl. No.: 09/110,206

[22] Filed: Jul. 6, 1998

[51] Int. Cl.$^6$ .................................................... G11C 7/00
[52] U.S. Cl. ...................................... 365/225.7; 365/201
[58] Field of Search ................................. 365/225.7, 201

[56] References Cited

U.S. PATENT DOCUMENTS

| | | | |
|---|---|---|---|
| 4,707,806 | 11/1987 | Takemae et al. | 365/96 |
| 5,047,664 | 9/1991 | Moyal et al. | 327/566 |
| 5,291,139 | 3/1994 | Fruhauf et al. | 327/63 |
| 5,384,727 | 1/1995 | Moyal et al. | 365/225.7 |
| 5,412,594 | 5/1995 | Moyal et al. | 365/225.7 |
| 5,428,311 | 6/1995 | McClure | 326/83 |
| 5,517,455 | 5/1996 | McClure et al. | 365/225.7 |
| 5,668,818 | 9/1997 | Bennett et al. | 371/22.31 |
| 5,708,291 | 1/1998 | Bohr et al. | 257/529 |
| 5,812,470 | 9/1998 | Ochoa et al. | 365/225.7 |

OTHER PUBLICATIONS

"A PROM Element Based on Salicide Agglomeration of Poly Fuses in a CMOS Logic Process", Alavi et al, IEDM 97, pp. 855–858.

"PROM fuse design scales to sub–0.25 micron", Robinson, Electronic Engineering Times, Sep. 29, 1997, p. 44.

*Primary Examiner*—Trong Phan
*Attorney, Agent, or Firm*—Oyen Wiggs Green & Mutala

[57] ABSTRACT

An integrated circuit fuse with a fuse element having an "open" state and a "closed" state. A fuse status indicator is provided to indicate whether the fuse element is "open" or "closed". A current driver is electrically connected between the fuse element and electrical ground. One input of a dual input multiplexer is electrically connected to the fuse status indicator. The multiplexer's other input receives a fuse status simulation signal. A simulation mode switching signal is applied to the multiplexer's select input. A fuse output signal is consequently provided at the multiplexer's output to simulate operation of the fuse element in either the "open" or the "closed" state. The fuse element can be opened by causing a current having a value exceeding a preselected minimum value to flow through the fuse element for a preselected minimum time. This is preferably accomplished by fabricating the current driver as an NMOS device having a size sufficiently large to conduct the minimum value current for the minimum time required to open the fuse element. Advantageously, a pre-driver is provided to rapidly turn the current driver on, upon receipt of a fuse opening signal.

10 Claims, 3 Drawing Sheets

POLY FUSES IN CMOS INTEGRATED CIRCUITS

TECHNICAL FIELD

This application pertains to a fuse structure which is compatible with standard digital CMOS processes, and which can be blown either at probe or at package (thus allowing package stress to be trimmed out of analog circuits) with a high probability of correctly adiabatically blowing the fuse, so as to inhibit fuse regrowth. Fuse operation can be simulated without actually blowing the fuse, allowing assessment of various fuse configurations on circuit performance.

BACKGROUND

Integrated circuits ("ICs") commonly incorporate one or more fuses, in conjunction with other circuit elements (possibly including more fuses), to control various circuit parameters (i.e. a digital value, a voltage, a current, a gain, a frequency response etc.). In general, a fuse operates in one of two states, namely a "closed" (i.e. low resistance) state, and an "open" (i.e. high resistance) state.

A variety of prior art fuses have been used in ICs. For example, one fuse structure is formed by the so-called "Zener zap" method. Such fuses operate in the "open" state by default, up to the Zener voltage; and are operated in the "closed" state by causing a very large current (typically >200 mA) to flow for a long period of time (typically >1 sec) through the fuse's Zener diode component. The objective is to increase the diode temperature to the point that the metal "spikes" through the junction, thus shorting the Zener diode. "Zener zap" fuses have very low leakage current and very low capacitance when operating in the "open" state at voltages sufficiently lower than the Zener breakdown voltage, both of which are desirable characteristics. Further, only a supply voltage (usually not the IC's own power supply) is needed to "close" such fuses, no extra process steps are required to form such fuses (assuming that Zener diodes are part of the standard process flow employed in fabricating the IC incorporating the fuse), and no extra chip pins are required if probe pads are used.

"Zener zap" fuses are however subject to some significant disadvantages. For example, such fuses can be operated in the "open" state only up to the Zener breakdown voltage. Further, a very large current (typically >200 mA, as aforesaid) must flow through fuse's Zener diode component for a very long time (typically >1 sec) to "close" the fuse. Thus, it may take several seconds to spike the junction as aforesaid. This increases test time and hence cost of the IC. Due to the large currents required, it is usually only possible to spike the junction at probe. Thus, package stress effects on some types of analog circuits can not be trimmed out. A further problem is that the fuse's resistance while operating in the "closed" state can vary widely, depending on factors such as the fabrication process employed, current, metal thickness, crystal orientation, etc. Moreover, the fuse's "open" resistance is voltage-dependent (the closer to the Zener breakdown voltage, the lower the resistance). Additionally, "Zener zap" fuses can of course only be formed by IC fabrication processes having good Zener diode fabrication characteristics.

Another common fuse structure is formed by the so-called "laser fuse link" method. Such fuses operate in the "closed" state by default, and are operated in the "open" state by using a laser to vaporize the fuse link. The link is usually made of a low resistance material such as gatePoly or metal. Desirable characteristics of laser link fuses include their very high "open" resistance (>10MΩ) if the laser is configured correctly; their low "closed" resistance (typically between 200Ω to 50 mΩ); their low capacitance; their usage of only a very small portion of the IC area; the fact that no extra process steps are required to fabricate such fuses; and, the fact that no extra chip pins or probe pads are needed to "open" the fuse (although probe pads or chip pins may be needed to measure the parameter being trimmed).

However, laser link fuses have some disadvantages, including: the need for a laser to "open" the fuse link; possible large variations in "open" resistance if the laser is not properly configured; the fact that there must be no passivation over the link and the resultant reliability hazard if the part is to go into a plastic package; the fact that such fuses can only be "opened" at probe for plastic packages and thus package stress effects on some types of analog circuits can not be trimmed out; and, the fact that it can take up to a full second to align the laser on the link and vaporize it, thus increasing test time and hence cost of the IC.

Another prior art fuse structure is formed by the so-called "poly fuse method #1" method. Such fuses operate in the "closed" state by default, and are operated in the "open" state by applying a high voltage (typically over 10 volts) across the fuse. In more modern fabrication processes this voltage is higher than the breakdown voltage of the devices comprising the IC and hence this voltage is usually forced across the fuse by an external voltage supply via probe pads. However, other probe pads are required to protect the rest of the circuitry from breakdown. Advantages of fuses formed by this method include their low "closed" resistance (typically <500Ω); the fact that passivation over the poly fuse need not be removed and hence such fuses exhibit better reliability than laser link fuses when encapsulated in plastic packages (however, if the passivation is removed then the voltage needed to "open" the fuse is reduced); the fact that no extra chip pins are required if the fuse is to be "opened" at probe with probe pads; and, their usage of only a small portion of the IC area (typically just the fuse and 2 probe pads).

Fuses formed by the poly fuse method #1 also have short-comings. For example, package stress effects on some types of analog circuits can not be trimmed out if the fuse is "opened" at probe. Further, it is possible that the fuse may "open" only marginally (i.e. exhibit an "open" resistance on the order of about 10 kΩ). This can happen if the fuse is not "opened" in the correct adiabatic manner by applying the full power of the supply to the fuse and not to its surroundings, resulting in incomplete vaporization. Hence, the sense circuitry must either detect a marginally "open" fuse and attempt to "re-open" it, failing which the part must be discarded; or, apply a much higher voltage across the fuse to ensure correct adiabatic "opening", which in turn necessitates careful protection of circuit devices incapable of withstanding such higher voltages. Since an external voltage source is required, it can take a up to one-half second to "open" the fuse (due to the large parasitic capacitances, the sense point of the supply, etc). This increases test time and hence cost of the IC.

A further problem is that, if a fuse formed by the poly fuse method #1 is not correctly "opened", the fuse may regrow over time (the so-called "poly re-growth" problem), potentially reducing the fuse's "open" resistance to that of a "closed" fuse (the re-growth resistance can be as low as 1 kΩ). Regrowth is caused by the voltage potential which is inevitably applied across the fuse during normal operation of the circuit; with the regrowth time increasing in inverse proportion to such voltage potential. If digital circuitry is used to sense the fuse, the voltage potential can be quite high, whereas in analog sense circuits the voltage potential in question is highly dependent upon the nature of the circuit.

Yet another prior art fuse structure is formed by the so-called "poly fuse method #2" method (see for example Moyal et al U.S. Pat. Nos. 5,384,727 and 5,412,594). Such fuses operate in the "closed" state by default, and are operated in the "open" state by passing an on-chip current (typically 15 mA) through the fuse via internal circuitry. This requires a fuse having sufficiently low "closed" resistance that the IR drop remains within the maximum supply voltage of the device. Fuses formed by this method usually cannot be placed in the direct analog path (i.e. indrict digital control of the analog parameter being trimmed is required). Advantages of fuses formed by this method include their low "closed" resistance (typically 200Ω); the fact that passivation over the poly fuse need not be removed and hence such fuses exhibit better reliability than laser link fuses when encapsulated in plastic packages (however, if the passivation is reduced then the voltage needed to "open" the fuse is reduced); the fact that no extra chip pins are required if the fuse is to be "opened" at probe; the fact that the fuse can be "opened" either at probe or at package; the fact that the fuse can be measured to determine whether it has been only marginally "opened", and corrective action taken to reopen the fuse (although this requires extra IC area, thus increasing cost of the IC); and, the fact that the fuse can be shorted out by providing extra circuitry to prevent poly re-growth, with the fuse state held by a flip-flop (although this also requires extra IC area and thus increases cost).

The main short comings of fuses formed by the poly fuse method #2 include the fact that if the fuse is "opened" at probe, then package stress effects on some types of analog circuits can not be trimmed out; the fact that the poly fuse may "open" only marginally ("open" resistance on the order of 10 kΩ); and, the fact that such fuses are subject to the aforementioned "poly re-growth" problem.

Other prior art fuse fabrication techniques requiring special processes have also been developed.

A desirable fuse and fuse fabrication method should:

Be usable either at probe or at package.

Consume no more circuit area than the fuse plus two probe pads.

Provide a mode for simulating fuse "opening" to assess circuit performance without actually "opening" the fuse, thereby simplifying trimming of analog parameters by predetermining the effect of the fuse on such parameters.

Provide a standby mode in which a very small idle current (<1 µA) flows through the fuse, such that at startup the state of the fuse can be determined (i.e. "open" or "closed") and stored, after which the fuse can be operated in standby mode with the aforementioned simulation mode being used to drive the circuit.

Ensure, to a high probability, that the fuse will "open" in the correct adiabatic manner, thereby minimizing the fuse re-growth problem (the standby mode should apply only a very small voltage potential across the fuse to prevent fuse re-growth).

Minimize sense circuitry detection of marginally "open" fuses which exhibit resistance of less than about 5 k.

Facilitate simultaneous "opening" of multiple fuses, thereby reducing test time.

Be implementable in a standard digital CMOS process.

The present invention provides a fuse and fuse fabrication method having the foregoing characteristics.

SUMMARY OF INVENTION

In accordance with the preferred embodiment, the invention provides an integrated circuit fuse with a fuse element having an "open" state and a "closed" state. A fuse status indicator is provided to indicate whether the fuse element is "open" or "closed". A current driver is electrically connected between the fuse element and electrical ground. One input of a dual input multiplexer is electrically connected to the fuse status indicator. The multiplexer's other input receives a fuse status simulation signal. A simulation mode switching signal is applied to the multiplexer's select input. A fuse output signal is consequently provided at the multiplexer's output to simulate operation of the fuse element in either the "open" or the "closed" state.

The fuse element can be opened by causing a current having a value exceeding a preselected minimum value to flow through the fuse element for a preselected minimum time. This is preferably accomplished by fabricating the current driver as an NMOS device having a size sufficiently large to conduct the minimum value current for the minimum time required to open the fuse element. Advantageously, a pre-driver is provided to rapidly turn the current driver on, upon receipt of a fuse opening signal.

DESCRIPTION

Figure 1:
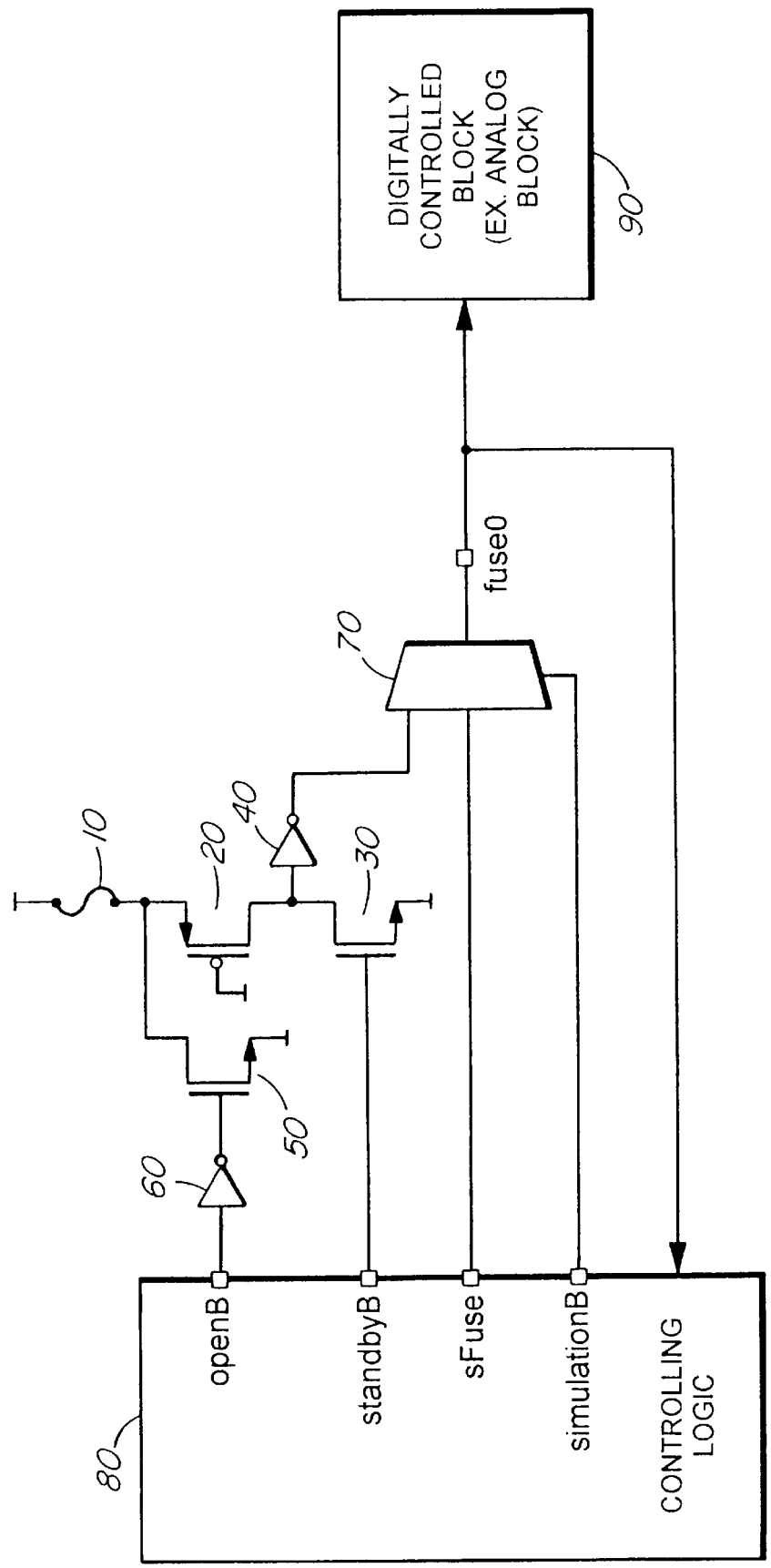
FIG. 1 is a block diagram of a fuse structure in accordance with the invention.

FIG. 1 illustrates a fuse structure in accordance with the invention. The fuse structure incorporates fuse element 10, level shifting devices 20 and 30, sensor 40, current driver 50, optional pre-driver 60, and digital multiplexer 70. Fuse 10 is preferably made of gatePoly, but can be made of any low resistance IC layer material. Level shifters 20, 30 are preferably a PMOS device and an NMOS device, respectively. Sensor 40 is preferably a simple digital inverter. Level shifters 20, 30 and sensor 40 together constitute a "fuse status indicator" for indicating whether fuse 10 is in the "open" state or in the "closed" state. Current driver 50 is preferably a large NMOS device. Pre-driver 60 is preferably a simple digital inverter.

A control logic block 80 operates the fuse structure by appropriately applying the "openB", "standbyB", and "simulationB" input control signals thereto. As hereinafter explained, these signals respectively control the current which "opens" the fuse, shift the structure into standby mode, and simulate fuse "opening" via the digital input signal "sFuse". A digital output signal "fuseO" is output by multiplexer 70 to an appropriate digitally controlled block 90 (which may for example be an analog block). Blocks 80 and 90 are shown only to clarify operation of the fuse structure; neither of blocks 80 or 90 form part of the invention, and they need not be described further.

The logic is such that when the fuse is "closed", fuseO is a logic "0"; and, when the fuse is "open", fuseO is a logic "1". Thus, in simulation mode, sFuse=0 means that the fuse is "closed" and sFuse=1 means that the fuse is "open". The following truth table more comprehensively explains the logic relationship of the inputs and outputs.

| MODE | standbyB | simulation | openB | fuseO | comments |
|------|----------|------------|-------|-------|----------|
| #1 | 0 | 0 | 0 | sFuse | Change fuse state to "open", in simulation mode, in standby mode. This is not the preferred state to "open" the fuse. |
| #2 | 0 | 0 | 1 | sFuse | Fuse state unchanged from before, in simulation mode, in standby mode. This is the preferred state in normal operation (i.e. after startup). |
| #3 | 0 | 1 | 0 | "1" | Change fuse state to "open", read fuse state mode, in standby mode. This is a preferred state to "open" the fuse. |
| #4 | 0 | 1 | 1 | X | Fuse state unchanged from before, read fuse state mode, in standby mode. This state is not very useful. |
| #5 | 1 | 0 | 0 | sFuse | Change fuse state to "open", in simulation mode, in active mode. This is NOT the preferred state to "open" the fuse. |
| #6 | 1 | 0 | 1 | sFuse | Fuse state unchanged from before, in simulation mode, in active mode. This state is not very useful. |
| #7 | 1 | 1 | 0 | "1" | Change fuse state to "open", read fuse state mode, in active mode. This is a preferred state to "open" the fuse. |
| #8 | 1 | 1 | 1 | Fuse state | Fuse state unchanged from before, read fuse state mode, in active mode. This state is used at power-up to get the fuse state into the digital control logic. |

Figure 2:
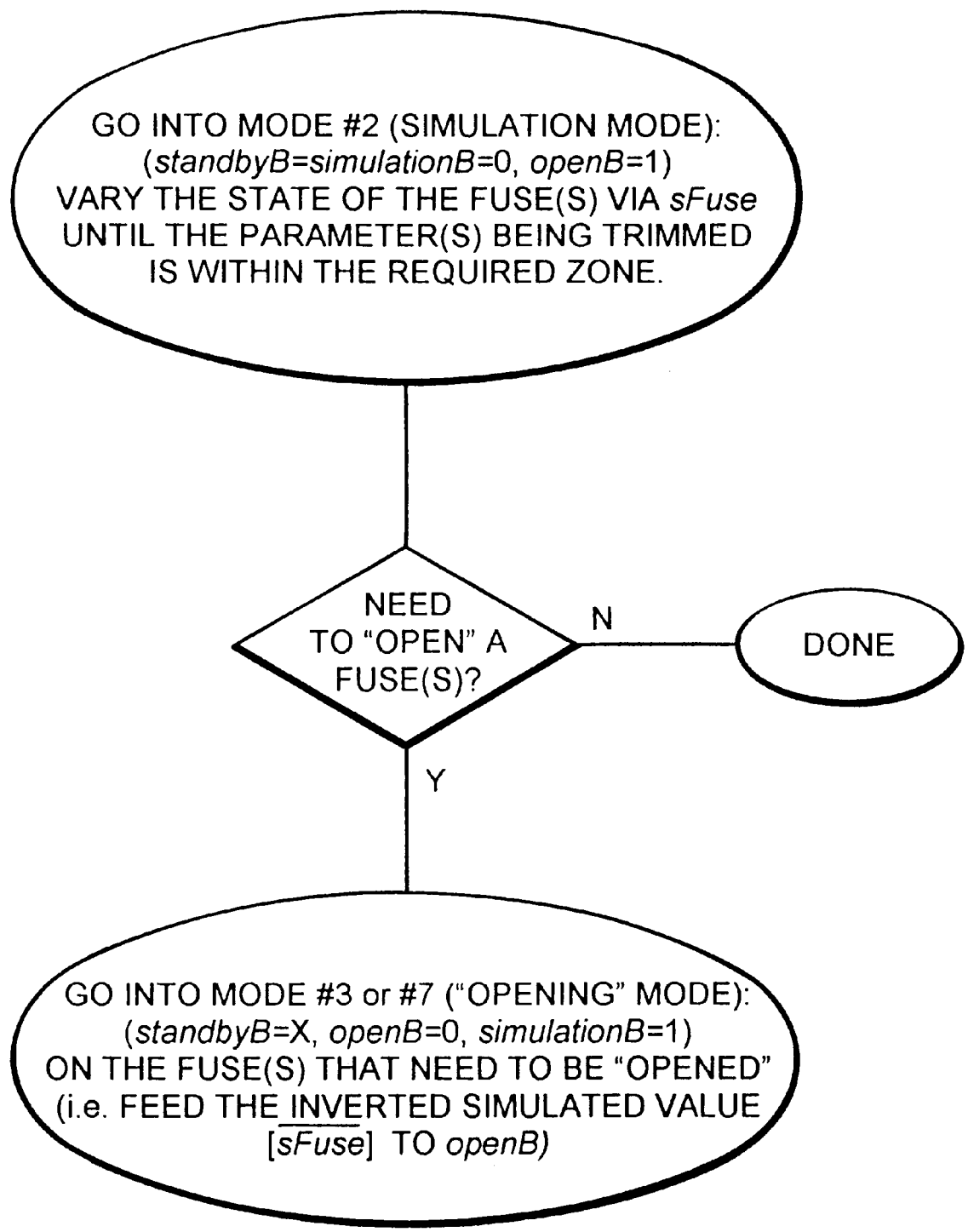
FIG. 2 is a flowchart illustrating the preferred method of "opening" a fuse.
Figure 3:
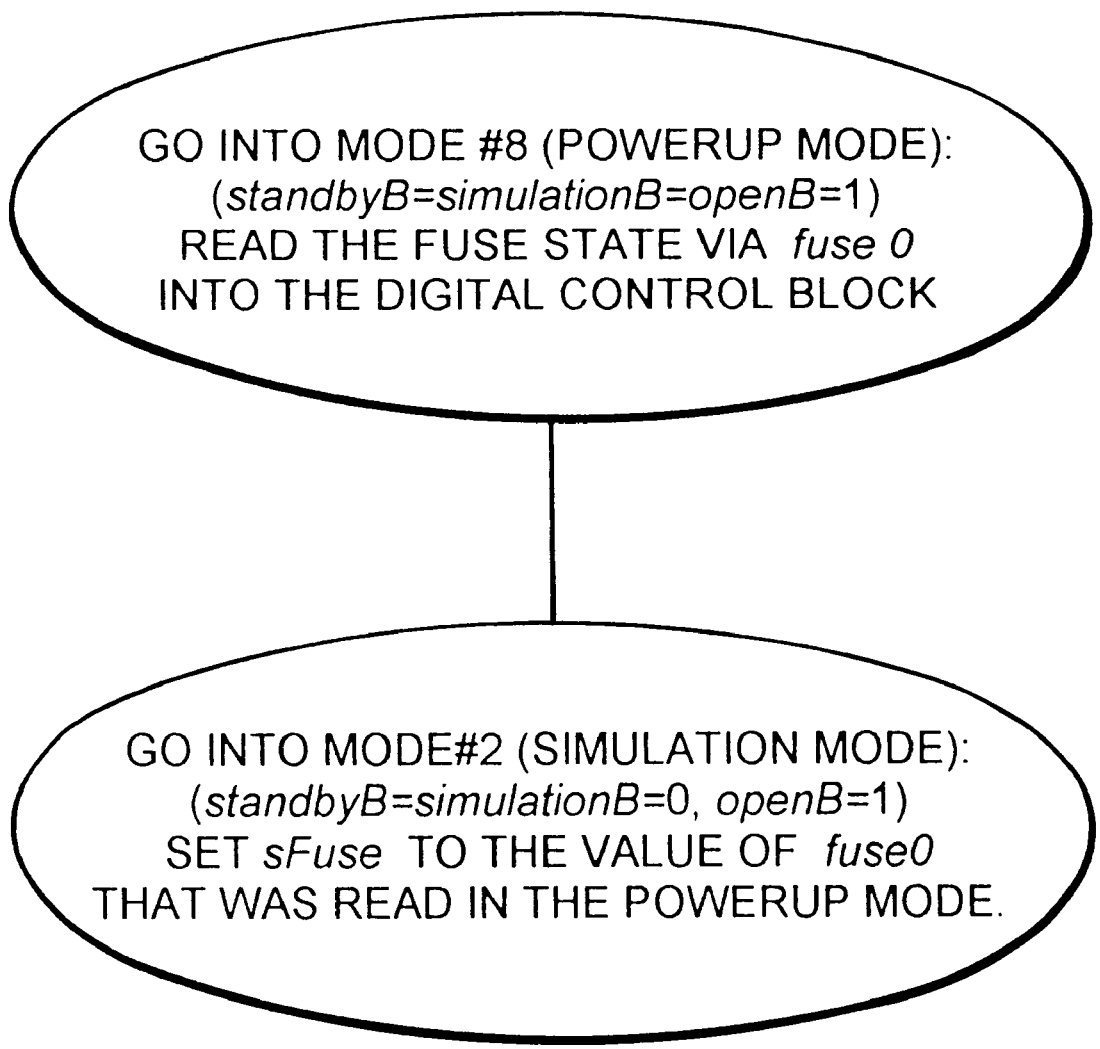
FIG. 3 is a flowchart illustrating the preferred fuse power-up sequence.

The FIGS. 2 and 3 flowcharts respectively depict the preferred method of "opening" the fuse structure and the preferred method of operating the fuse structure at chip power-up.

More particularly, in order to correctly adiabatically "open" the fuse, one must raise the fuse temperature very quickly by applying the full power of the supply to the fuse while avoiding heating of the surrounding circuit area. This can be accomplished in two ways. First, one may ensure that current driver 50 turns on very quickly. To achieve this, the capacitance of the fuse structure must be sufficiently small that current driver 50 need not be too large (i.e. current driver 50 should be just large enough to allow the minimum required current to flow). Rapid turn on of current driver 50 can also be achieved by providing a pre-driver 60 (this is usually required in any case, since driver 50 is typically of such a size that it presents a capacitive load to the digital logic). A second technique for rapidly raising the fuse temperature is to make the fuse width as small as possible, thus increasing the current density through the fuse and thereby raising the temperature in the fuse.

The FIG. 2 flow chart illustrates the preferred method of "opening" a fuse. Specifically, the standbyB and simulationB inputs are set to logic 0 and the openB input is set to logic 1, thereby placing the FIG. 1 fuse structure in mode #2 (also called "simulation mode"). While the fuse structure remains in simulation mode, the fuse parameter of interest is trimmed by changing the sFuse input to vary the state of the fuse element until the fuse parameter of interest is brought within the desired range. After the fuse parameter of interest has been successfully trimmed in simulation mode, the openB input is then set to logic 0 and the simulationB input is set to logic 1 to place the FIG. 1 fuse structure in either one of mode #3 or mode #7 (also called "opening mode". The desired fuse(s) are then opened by applying the sFuse value derived as aforesaid in simulation mode to the openB input.

The FIG. 3 flow chart illustrates the preferred sequence for powering up the FIG. 1 fuse structure. Specifically, immediately after power up, the standbyB, simulationB and openB inputs are set to logic 1, thereby placing the FIG. 1 fuse structure in mode #8 (also called "powerup mode". The current fuse state (i.e. "opened" or "closed") is then determined by reading the fuseO output value into digitally controlled block 90. The standbyB and simulations inputs are then set to logic 0 and the openB input is set to logic 1 to place the fuse structure in mode #2 ("simulation mode"). Finally, the previously determined fuseO value is applied to the sFuse input so that the state of the fuse structure in simulation mode will correctly correspond to the state of the fuse structure as determined at powerup.

Fuse 10 has a low nominal resistance and must be quite narrow to allow a large current to flow if driver 50 is to pull the end of the fuse to ground. However, the width of fuse 10 is preferably about 25% greater than the minimum width permitted by the particular IC fabrication process employed. This is because very large variations in width, and hence resistance, are usually caused if one attempts to reduce the width of fuse 10 to the minimum possible width, thus producing large variations in the amount of current and time required to "open" different fuses. Clearly, the nominal fuse resistance and driver size are supply and process dependant. For the embodiment illustrated, a 3.3V supply was required and a nominal fuse resistance of 50Ω was selected, with a minimum current sink of 60mA. This produced a large power spike (180 mW) having a rise time of less than 1 nS, for a short period of time until the fuse "opens". Typically the time required to "open" the fuse is within the 1 to 100 $\mu$S range.

The sizes of level shifting devices 20, 30 are determined by the threshold point of sensing device 40 and by the need to check for fuse resistances in excess of 5 kΩ. If level shifting devices 20, 30 are fabricated as PMOS and NMOS devices respectively, one can easily use one of the gates as the standby control. Clearly this will remove idle current (assuming the fuse was "closed"), but it also effectively removes any bias voltage across the fuse (independently of the state of the fuse), as the DC resistance of the OFF MOS device exceeds 100MΩ, hence preventing fuse re-growth. The NMOS gate was used in the embodiment illustrated.

If the fuse is correctly "opened" and if control logic block 80 is in standby mode, then the input to sensor 40 is undefined. If sensor 40 is an inverter (as illustrated in the FIG. 1 embodiment) this can give rise to high idle currents. However, as long as the fuse is first read (i.e. operated in its active state) at power-up, then the parasitic capacitance will hold the input at a level sufficient to prevent high currents.

Digital multiplexer 70 facilitates either reading or simulation of operation of the fuse. If digitally controlled block 90 is an analog block, the simulation mode is a very useful aid for determining the fuse value(s) required to yield correct performance, and as an aid to simultaneously "opening" all of the required fuses. This speeds up test time significantly, in comparison to prior art methodologies in which a single fuse is "opened" followed by re-measurement of the parameter of interest to determine whether the desired result has occurred. To further accelerate test time, one could configure the analog block in such a manner that, even without "opening" any fuses, the typically processed IC will work.

As will be apparent to those skilled in the art in the light of the foregoing disclosure, many alterations and modifications are possible in the practice of this invention without departing from the spirit or scope thereof. Accordingly, the scope of the invention is to be construed in accordance with the substance defined by the following claims.

What is claimed is:

1. An integrated circuit fuse, comprising:
   (a) a fuse element having an "open" state and a "closed" state;
   (b) a fuse status indicator for indicating whether said fuse element is in said "open" state or in said "closed" state;
   (c) a current driver electrically connected between said fuse element and electrical ground; and,
   (d) a multiplexer having a first input port electrically connected to said fuse status indicator, a second input port for receiving a fuse status simulation signal, a third input port for receiving a simulation mode switching signal and an output port for providing a fuse output signal having an "open" state and a "closed" state.

2. A fuse as defined in claim 1, wherein said fuse is fabricated by a CMOS process.

3. A fuse as defined in claim 1, wherein:
   (a) said fuse element is openable by causing a current having a value exceeding a preselected minimum value to flow through said fuse element for a preselected minimum time; and,
   (b) said current driver further comprises an NMOS device having a size sufficiently large to conduct said minimum value current for said minimum time to open said fuse element.

4. A fuse as defined in claim 3, further comprising a pre-driver having an input for receiving a fuse opening signal and an output electrically connected to said current driver, said pre-driver for rapidly turning on said current driver upon receipt of said fuse opening signal by said pre-driver input.

5. A fuse as defined in claim 4, wherein said pre-driver further comprises a digital inverter.

6. A fuse as defined in claim 3, wherein said fuse element has low nominal resistance.

7. A fuse as defined in claim 3, wherein said fuse element is formed of gatePoly.

8. A fuse as defined in claim 1, wherein said fuse status indicator further comprises:
   (a) a first level shifting device characterized by a high DC resistance off state, said first level shifting device having an input port, an output port and a switch port, said input port electrically connected to said fuse element and said switch port electrically connected to electrical ground;
   (b) a second level shifting device having an input port, an output port and a switch port, said second level shifting device input port electrically connected to a first level shifting device output port, said second level shifting device output port electrically connected to electrical ground and said second level shifting device switch port for receiving a standby mode signal;
   (c) a sensor electrically connected between said second level shifting device input port and said multiplexer first input; wherein:
      (i) said first level shifting device is turned off when said standby mode signal is received by said second level shifting device switch port, thereby removing substantially all bias voltage across said fuse element; and,
      (ii) said first level shifting device is turned on when said standby mode signal is not received by said second level shifting device switch port, thereby allowing application of a bias voltage across said fuse element.

9. A fuse as defined in claim 8, wherein said first level shifting device is a PMOS device and said second level shifting device is an NMOS device.

10. A fuse as defined in claim 8, wherein said sensor is a digital inverter.

* * * * *